United States Patent
Jeyapaul et al.

(10) Patent No.: US 10,884,850 B2
(45) Date of Patent: Jan. 5, 2021

(54) FAULT TOLERANT MEMORY SYSTEM

(71) Applicant: Arm Limited, Cambridge (GB)

(72) Inventors: Reiley Jeyapaul, Haverhill (GB);
Roxana Rusitoru, Cambridge (GB);
Jonathan Curtis Beard, Austin, TX (US)

(73) Assignee: Arm Limited, Cambridge (GB)

( * ) Notice: Subject to any disclaimer, the term of this patent is extended or adjusted under 35 U.S.C. 154(b) by 137 days.

(21) Appl. No.: 16/043,975

(22) Filed: Jul. 24, 2018

(65) Prior Publication Data

US 2020/0034230 A1 Jan. 30, 2020

(51) Int. Cl.
| | |
|---|---|
| *G06F 11/00* | (2006.01) |
| *G06F 11/10* | (2006.01) |
| *G06F 3/06* | (2006.01) |
| *G06F 11/20* | (2006.01) |

(Continued)

(52) U.S. Cl.
CPC ........ *G06F 11/1068* (2013.01); *G06F 3/0614* (2013.01); *G06F 3/0631* (2013.01); *G06F 3/0653* (2013.01); *G06F 3/0683* (2013.01); *G06F 11/008* (2013.01); *G06F 11/106* (2013.01); *G06F 11/2094* (2013.01); *G06F 12/0246* (2013.01); *G11C 29/70* (2013.01)

(58) Field of Classification Search
CPC ............... G06F 11/1068; G06F 11/106; G06F 11/2094; G06F 11/1044; G06F 3/0614; G06F 3/0631; G06F 3/0653; G06F 3/0683

See application file for complete search history.

(56) References Cited

U.S. PATENT DOCUMENTS

| | | |
|---|---|---|
| 4,792,897 A | 12/1988 | Gotou et al. |
| 5,361,337 A | 11/1994 | Okin |
| 5,426,750 A | 6/1995 | Becker et al. |

(Continued)

FOREIGN PATENT DOCUMENTS

| | | |
|---|---|---|
| EP | 3 128 415 | 2/2017 |
| WO | WO 2016/160220 | 10/2016 |

(Continued)

OTHER PUBLICATIONS

Arm, "ARMv8-A Address Translation," https://static.docs.arm.com/100940/0100/armv8_a_address%20translation_100940_0100_en.pdf, Feb. 28, 2017.

(Continued)

*Primary Examiner* — Philip Guyton
(74) *Attorney, Agent, or Firm* — Leveque IP Law, P.C.

(57) ABSTRACT

A memory system for a data processing apparatus includes a fault management unit, a memory controller (such as a memory management unit or memory node controller), and one or more storage devices accessible via the memory controller and configured for storing critical data. The fault management unit detects and corrects a fault in the stored critical data, a storage device or the memory controller. A data fault may be corrected using a copy of the data, or an error correction code, for example. A level of failure protection for the critical data, such as a number of copies, an error correction code or a storage location in the one or more storage devices, is determined dependent upon a failure characteristic of the device. A failure characteristic, such as an error rate, may be monitored and updated dynamically.

23 Claims, 11 Drawing Sheets

(51) Int. Cl.
*G06F 12/02* (2006.01)
*G11C 29/00* (2006.01)

(56) References Cited

U.S. PATENT DOCUMENTS

| | | | |
|---|---|---|---|
| 5,577,231 A | 11/1996 | Scalzi et al. | |
| 5,752,275 A | 5/1998 | Hammond | |
| 5,867,649 A | 2/1999 | Larson | |
| 5,928,367 A * | 7/1999 | Nelson | G06F 11/1666 714/6.3 |
| 6,021,476 A | 2/2000 | Segars | |
| 6,345,241 B1 | 2/2002 | Brice | |
| 6,349,355 B1 | 2/2002 | Draves et al. | |
| 6,633,963 B1 | 10/2003 | Ellison et al. | |
| 6,704,873 B1 | 3/2004 | Underwood | |
| 6,715,145 B1 | 3/2004 | Bowman-Amuah | |
| 6,731,288 B2 | 5/2004 | Parsons | |
| 6,789,156 B1 | 9/2004 | Waldspurger | |
| 6,822,959 B2 | 11/2004 | Galbi et al. | |
| 7,181,594 B2 | 2/2007 | Wilkinson et al. | |
| 7,225,300 B1 | 5/2007 | Choquette et al. | |
| 7,343,603 B1 | 3/2008 | Fresko | |
| 7,356,667 B2 | 4/2008 | Harris et al. | |
| 7,373,466 B1 | 5/2008 | Conway | |
| 7,424,599 B2 | 9/2008 | Kissell et al. | |
| 7,437,724 B2 | 10/2008 | Wolrich et al. | |
| 7,472,253 B1 | 12/2008 | Cameron et al. | |
| 7,512,769 B1 | 3/2009 | Lowell et al. | |
| 7,668,165 B2 | 2/2010 | Hoskote | |
| 8,250,519 B2 | 8/2012 | Budko et al. | |
| 8,327,187 B1 | 12/2012 | Metcalf | |
| 8,386,745 B2 | 2/2013 | Kegel et al. | |
| 8,656,397 B2 | 2/2014 | Eidus et al. | |
| 8,667,249 B2 | 3/2014 | Baxter et al. | |
| 8,850,168 B2 | 9/2014 | Yamamoto et al. | |
| 8,984,255 B2 | 3/2015 | Hsu et al. | |
| 9,081,501 B2 | 7/2015 | Asaad et al. | |
| 9,081,706 B2 | 7/2015 | Koka et al. | |
| 9,122,714 B2 | 9/2015 | Varadarajan et al. | |
| 9,208,103 B2 | 12/2015 | Kessler et al. | |
| 9,235,529 B2 | 1/2016 | Koka et al. | |
| 9,250,901 B2 | 2/2016 | Sodhi et al. | |
| 9,251,089 B2 | 2/2016 | Gschwind | |
| 9,268,694 B2 | 2/2016 | Snyder et al. | |
| 9,367,459 B2 | 6/2016 | Yamashita et al. | |
| 9,582,312 B1 | 2/2017 | Karppanen | |
| 9,639,476 B2 | 5/2017 | Chin et al. | |
| 9,645,941 B2 | 5/2017 | Mukherjee et al. | |
| 9,690,714 B1 | 6/2017 | Sites | |
| 9,785,557 B1 | 10/2017 | Frey et al. | |
| 9,996,386 B2 | 6/2018 | Rauchfuss et al. | |
| 10,037,227 B2 | 7/2018 | Therien et al. | |
| 10,114,958 B2 | 10/2018 | Sell | |
| 10,133,675 B2 | 11/2018 | Hansson et al. | |
| 10,180,913 B1 | 1/2019 | Aingaran et al. | |
| 2002/0026502 A1 | 2/2002 | Phillips | |
| 2004/0064668 A1 | 4/2004 | Kjos et al. | |
| 2004/0111558 A1 * | 6/2004 | Kistler | G06F 3/0689 711/114 |
| 2004/0117593 A1 | 6/2004 | Uhlig et al. | |
| 2004/0215893 A1 | 10/2004 | Emerson et al. | |
| 2005/0010728 A1 | 1/2005 | Piry et al. | |
| 2005/0165758 A1 | 7/2005 | Kasten et al. | |
| 2005/0138515 A1 | 8/2005 | Hyduke | |
| 2005/0273571 A1 | 12/2005 | Lyon et al. | |
| 2006/0253894 A1 | 11/2006 | Bookman | |
| 2006/0277390 A1 | 12/2006 | Zuraski et al. | |
| 2006/0288177 A1 | 12/2006 | Shaw | |
| 2007/0180197 A1 | 8/2007 | Wright | |
| 2007/0186054 A1 | 8/2007 | Kruckmeyer et al. | |
| 2008/0104557 A1 | 5/2008 | Gopaladrishnan et al. | |
| 2008/0270653 A1 | 10/2008 | Balle et al. | |
| 2009/0089537 A1 | 4/2009 | Vick et al. | |
| 2009/0113164 A1 | 4/2009 | Rajamony et al. | |
| 2009/0172343 A1 | 7/2009 | Savagaonkar | |
| 2009/0182971 A1 | 7/2009 | Greiner et al. | |
| 2009/0234987 A1 | 9/2009 | Lee et al. | |
| 2011/0113410 A1 | 5/2011 | Loen | |
| 2011/0145542 A1 | 6/2011 | Morrow | |
| 2011/0208935 A1 | 8/2011 | Grisenthwaite | |
| 2012/0324148 A1 | 12/2012 | Stonelake et al. | |
| 2013/0179666 A1 | 7/2013 | Yamashita et al. | |
| 2013/0227248 A1 | 8/2013 | Mehta et al. | |
| 2014/0006734 A1 | 1/2014 | Li et al. | |
| 2014/0013074 A1 | 1/2014 | Koka | |
| 2014/0052917 A1 | 2/2014 | Koka et al. | |
| 2014/0208064 A1 | 7/2014 | Basu et al. | |
| 2014/0281363 A1 | 9/2014 | Tian | |
| 2014/0351519 A1 | 11/2014 | Munoz | |
| 2015/0100719 A1 * | 4/2015 | Lin | G06F 11/1048 711/103 |
| 2015/0106571 A1 | 4/2015 | Bernard et al. | |
| 2015/0205885 A1 | 7/2015 | Zhou et al. | |
| 2015/0254104 A1 | 9/2015 | Kessler et al. | |
| 2015/0286639 A1 | 10/2015 | Bordawekar | |
| 2015/0301949 A1 | 10/2015 | Koka et al. | |
| 2015/0301951 A1 | 10/2015 | Bybell et al. | |
| 2015/0325272 A1 | 11/2015 | Murphy | |
| 2016/0085677 A1 | 3/2016 | Loh et al. | |
| 2016/0147555 A1 | 5/2016 | Hepkin | |
| 2016/0147620 A1 | 5/2016 | Lesartre et al. | |
| 2016/0239415 A1 | 8/2016 | David et al. | |
| 2016/0283399 A1 | 9/2016 | Das | |
| 2017/0031832 A1 | 2/2017 | Hwang | |
| 2017/0109289 A1 | 4/2017 | Gonzalez | |
| 2017/0147254 A1 | 5/2017 | Adams et al. | |
| 2017/0153987 A1 | 6/2017 | Gaonkar et al. | |
| 2017/0161194 A1 | 6/2017 | Loh | |
| 2017/0177484 A1 | 6/2017 | Conway | |
| 2017/0185528 A1 | 6/2017 | Hansson et al. | |
| 2017/0236243 A1 | 8/2017 | Smith | |
| 2017/0286421 A1 | 10/2017 | Hayenga et al. | |
| 2018/0018278 A1 | 1/2018 | Bradbury et al. | |
| 2018/0150315 A1 | 5/2018 | Dunham et al. | |
| 2018/0150321 A1 | 5/2018 | Dunham et al. | |
| 2018/0150322 A1 | 5/2018 | Dunham et al. | |
| 2019/0018794 A1 * | 1/2019 | Beard | G06F 9/5016 |
| 2019/0147364 A1 * | 5/2019 | Alt | G06F 3/0647 706/12 |

FOREIGN PATENT DOCUMENTS

| | | |
|---|---|---|
| WO | WO 2016/162817 | 10/2016 |
| WO | 2016/204913 | 12/2016 |

OTHER PUBLICATIONS

Yang, Junfeng, "Process and Address Space," https://web.archive.org/web/20170329090956if_/http://www.cs.columbia.edu:80"junfeng/12sp-w4118/lectures/104-proc.pdf, Mar. 29, 2017.

Anonymous, "Fork (system call)," https://web.archive.org/web/20150124080230/https://en.wikipedia.org/wiki/Fork_(system_call), Jan. 24, 2015.

Oehmke, David W., Nathan L. Binkert, Steven K. Reinhardt and Trevor J Mudge. "Design and Applications of a Virtual Context Architecture." (2004).

Jayneel Gandhi, "Efficient Memory Virtualization," Thesis, University of Wisconsin-Madison, Aug. 19, 2016.

Memory Management Basics, www.idc-online.com/technical_references/pdfs/information_technology/Memory_Management_Basics.pdf, 2014.

Zhong Shao, CS422/522 Design & Implementation of Operating Systems Lecture 13: Address Translation, Yale University, Oct. 15, 2015, https://web.archive.org/web/20151217223456/http://flint.cs.yale.edu/cs422/lectureNotes/L13.pdf.

Rouse, Margaret, Definition translation lookaside buffer (TLB), https://whatis.techtarget.com/definition/translation-look-aside-buffer-TLB, Sep. 2014.

Anedda et al., "Suspending, migrating and resuming HPC virtual clusters," Future Generation Computer Systems 26, MNay 20, 2010, pp. 1063-1072.

(56) References Cited

OTHER PUBLICATIONS

Basu et al, "Efficient virtual memory for big memory servers," ACM SIGARCH Computer Architecture News—ICSA '13, vol. 41 Issue 3, Jun. 2013, pp. 237-248.

J. Gandhi et al., "Range Translations for Fast Virtual Memory," in IEEE Micro, vol. 36, No. 3, pp. 118-126, May-Jun. 2016. doi: 10.1109/MM.2016.10.

Karakostas et al., "Redundant Memory Mappings for Fast Access to Large Memories," ISCA'15, Jun. 13-17, 2015.

R. W. Pfile, D. A. Wood and S. K. Reinhardt, "Decoupled Hardware Support for Distributed Shared Memory," Computer Architecture, 1996 23rd Annual International Symposium on, May 24, 1996, pp. 34-34. doi: 10.1109/ISCA.1996.10010.

Petter Svärd, Benoit Hudzia, Johan Tordsson, and Erik Elmroth. 2011. Evaluation of delta compression techniques for efficient live migration of large virtual machines. In Proceedings of the 7th ACM SIGPLAN/SIGOPS international conference on Virtual execution environments (VEE '11). Jul. 2011, ACM, New York, NY, USA, 111-120. DOI=http://dx.doi.org/10.1145/1952682.1952698.

U.S. Appl. No. 15/819,328, filed Nov. 21, 2017.

Bang, Kwanhu & Park, Sang-Hoon & Jun, Minje & Chung, Eui-Young. (2011). A memory hierarchy-aware metadata management technique for Solid State Disks. Midwest Symposium on Circuits and Systems. 1-4.

C. H. Park, T. Heo, J. Jeong and J. Huh, "Hybrid TLB coalescing: Improving TLB translation coverage under diverse fragmented memory allocations," 2017 ACM/IEEE 44th Annual International Symposium on Computer Architecture (ISCA), Toronto, ON, 2017, pp. 444-456.

Chao-Jui Chang, Jan-Jan Wu, Wei-Chung Hsu, Pangfeng Liu, and Pen-Chung Yew. 2014. Efficient memory virtualization for Cross-ISA system mode emulation. SIGPLAN Not. 49, 7 (Mar. 2014), 117-128.

Grocutt et al., U.S. Appl. No. 15/825,524 unpublished application, filed Nov. 29, 2017.

L. Fiorin, G. Palermo, S. Lukovic, V. Catalano and C. Silvano, "Secure Memory Accesses on Networks-on-Chip," in IEEE Transactions on Computers, vol. 57, No. 9, pp. 1216-1229, Sep. 2008.

M. D. Flouris and A. Bilas, "Violin: a framework for extensible block-level storage," 22nd IEEE / 13th NASA Goddard Conference on Mass Storage Systems and Technologies (MSST'05), Monterey, CA, USA, 2005, pp. 128-142.

Porquet, J & Greiner, A & Schwarz, C., "NoC-MPU: A secure architecture for flexible co-hosting on shared memory MPSoCs, " Design, Automation & Test. in Europe, 1-4, 2001.

Sambit K. Shukla, Laxmi N. Bhuyan, "A hybrid shared memory heterogenous execution platform for PCIe-based GPGPUs," 2013 20th International Conference on High Performance Computing (HiPC), vol. 1, pp. 343-352, 2013.

T. Wood et al., "CloudNet: Dynamic Pooling of Cloud Resources by Live WAN Migration of Virtual Machines," in IEEE/ACM Transactions on Networking, vol. 23, No. 5, pp. 1568-1583, Oct. 2015.

U.S. Appl. No. 15/825,524, filed Nov. 29, 2017, Inventor: Grocutt et al.

\* cited by examiner

FAULT TOLERANT MEMORY SYSTEM

TECHNICAL FIELD

The present disclosure relates to a memory system of a data processing apparatus having improved reliability, availability and serviceability.

BACKGROUND

A data processing apparatus may include multiple computing devices, of various types, that utilize a memory system comprising one or more memories accessed via one or more memory management units or memory node controllers. Faults may occur at a number of locations in the system. For example, random bit errors may occur in stored data values, or a failure may occur in a storage device, a memory node controller (MNC), or a memory management unit (MMU).

Approaches to overcoming bit errors in data include the use of an error correcting code (ECC), which stores additional information to enable the correction of some bit errors, and the use of redundancy, as in Redundant Array of Independent Disks (RAID), which duplicates physical memory devices and/or physical storage disks.

An ECC may provide, for example, Single Error Correction Double Error Detection (SECDEC), in which a single bit error can be corrected and one or two bit errors detected, or Double Error Correction Triple Error Detection (DECTED), in which up to two bit errors can be corrected and up to three bit errors detected. However, an ECC is limited in the number of bits that can be corrected.

When multiple copies of data are stored, error detection, such as parity or a checksum, may be used to detect when one copy is in error so that an alternate copy may be used. Alternatively, when three or more copies are available, a 'voting' system may be used to determine to select the value to be used.

A limitation of present approaches, using redundant storage, is that an entire memory system is duplicated. This is expensive. A further limitation is that the approaches do not tolerate failure of a memory node controller, memory management unit or other memory device, or multi-bit errors in the memory. A still further limitation of present approaches is that the system configuration is static and takes no account of changing performance of the memory and storage components of the system. A still further limitation is that existing methods for data placement and allocation fail to take account of device health.

There exists a need, therefore, for an efficient, fault tolerant memory system.

DETAILED DESCRIPTION OF THE EMBODIMENTS

Figure 1:
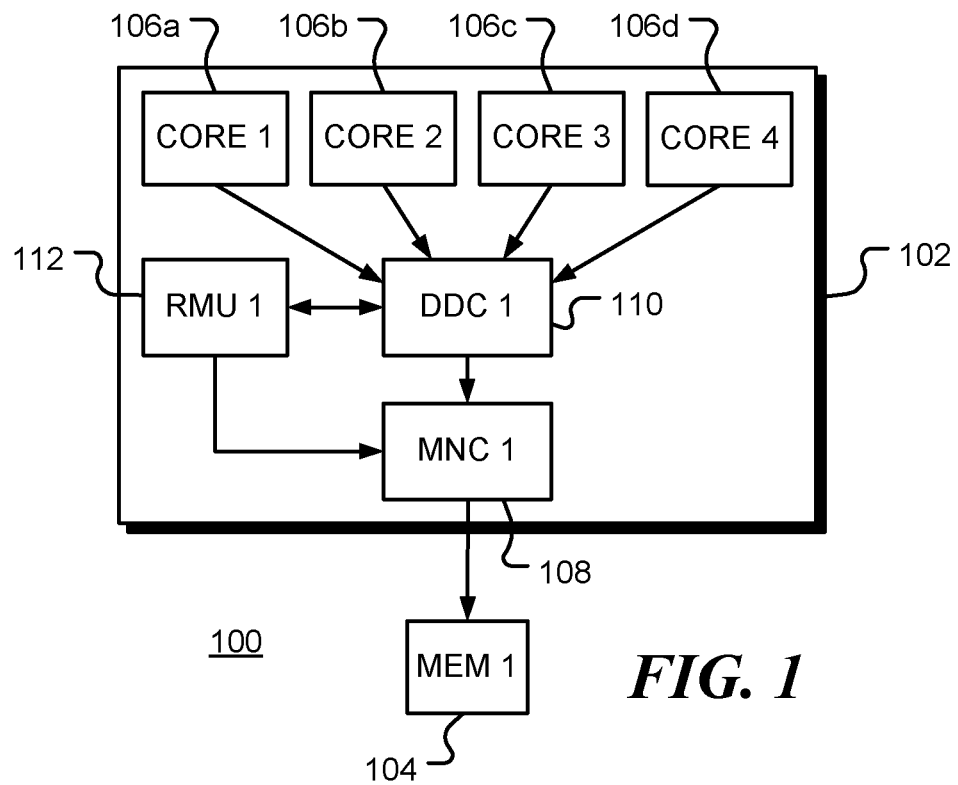
FIG. 1 is a block diagram of a data processing system, consistent with certain embodiments of the disclosure.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

The present disclosure is related to a mechanism for improving reliability, availability and serviceability (RAS) in a memory system of a data processing apparatus. The memory system includes one or more memory controllers, such a memory management units or memory node controllers, that provide access to a number of data storage devices for processing units of the data processing apparatus.

Herein, 'memory' and 'storage' are taken to include both volatile memory, such as Random Access Memory (RAM), and non-volatile memory, such as flash memory, and disk storage. A memory system may include various types of volatile and non-volatile memory.

An RAS Management Unit (RMU) is provided that is configured to detect an error in data stored on a storage device, an error in a storage device itself or an error in a memory controller. Various levels of protection of critical data against errors are provided. In some embodiments, protection is provided by redundancy in the memory system. Once the RMU detects an error, the error is corrected when possible. A number of levels of redundancy may be provided.

Firstly, data may be stored in conjunction with an error correction code (ECC). The EEC provides additional information dependent upon the data written to the storage device, and may be used to detect and correct one or more bit errors in the stored. For example, in the case of a 1-bit error in data, an ECC for the data is used to recover from the 1-bit error.

Secondly, one or more copies of data may be stored. The copies may be stored in the same storage device as the original data or in a different storage device. When an error is detected in the original data, it is replaced by one of the copies. Errors may be detected in a number of different ways, such as the use of parity bits, checksums, ECCs, etc. For example, in the case of 2-bit errors, the SECDED (Single Error Correction Double Error Detection) mechanism will detect single or 2-bit errors, but only a single bit error can be recovered from. In the case of multi-bit errors, the SECDED and ECC codes may not be useable for correction. Correct data will have to be recovered from the duplicate data. In this case, the specific erroneous data can be replaced by the duplicate data to enable recovery from the error.

Alternatively, when three or more copies are saved, a 'voting' system may be used to identify the correct copy of the data.

Error protection may also be provided by the use of high resilience storage (HRS) for critical data.

In accordance with an aspect of the present disclosure, only a subset of the data is protected against errors. This subset is referred to herein as 'critical' data, since the subset may include data, such as configuration and context data, that is critical for correct operation of the data processing apparatus. However, a user may designate any data 'critical' whether or not the data is required for correct operation, so the subset may also be referred to as 'fault protected' data.

In one embodiment, a subset of the memory address space is designated as storage for critical data. For example, when the memory address space is arranged as a number of address 'ranges', some of the address ranges may be allocated for critical data. In operation, virtual addresses used by processing units are translated or mapped (in one or steps) to physical address using mapping tables of some kind. These mapping tables are augmented with information (such as a criticality bit) to indicate when data is to be protected during a write access or error-corrected during a read access. Based on the type and/or level of protection required, and probability of failure, the criticality bit could cause the data to be duplicated, saved in high-resilient memory device, if available, and/or saved in a ECC protected memory device.

A third level of redundancy is provided by secondary storage devices. When an error is detected in a primary storage device, the RMU operates to replace the primary storage device with a secondary storage device.

A fourth level of redundancy is provided by secondary memory node controllers (MNCs). A secondary MNC is configured to enable access to the same storage devices as the primary MNC it is to replace. When an error is detected in the primary MNC, the RMU operates to replace the primary MNC with the secondary MNC.

A further aspect of the disclosure is a mechanism for providing dynamic configuration of the type and nature of protection (or RAID levels) and dynamic scheduling and movement of data based on the reliability of the memory devices in the memory system.

FIG. 1 is a block diagram of a data processing apparatus 100 consistent with certain embodiments of the disclosure. Processing node 102 is configured to access a storage device 104 (MEM 1), such as a memory device. Processing node 102 includes one or more processing cores (106a, 106b, 106c and 106d in this example) that are coupled via memory node controller 108 (MNC 1) and data delivery cache (DDC 1) 110 to storage device 104. reliability, availability and serviceability (RAS) management unit (RMU 1) 112 manages operation of the memory system to provide improved RAS.

In accordance with an embodiment of the disclosure, an identifier such as a critical-bit is added to the memory system to identify 'critical data'. The system architecture is configured to provide a mechanism that enables automatic, hardware-driven, duplication and recovery from transient errors and faults in the 'critical data' stored in the memory hierarchy.

This approach is applicable to any memory system that contains a mechanism to group and manage data (as pages or ranges or segments). In the description below, a range-based memory system is assumed, in which data is grouped as variable (at the time of data allocation) sized ranges. Such as system is described in co-pending patent application Ser. No. 15/819,328, which is hereby incorporated herein in its entirety. However, the disclosed is not limited to this memory arrangement.

All data marked by the user as critical data (upon allocation of memory, for example) will have a Critical-Range bit set and one or more duplicate copies of the data will be maintained as backup. This duplication may be hidden from any coherence mechanism of the data processing apparatus, so that no changes in the mechanism are required. The RAS Management Unit 112 and the MNC controller 108 together, which are aware of the duplicate copies, enable a single correct view of the data as seen by the coherence mechanism.

Data that provides a description of the configuration or state of the data processing apparatus may be marked as critical.

For example, table information, which supports the mapping between virtual and physical addresses, may be marked as critical. This ensures that, in the case of storage failure, mapping information, such as range table or page table information, will not be lost.

In addition, context information related to thread execution by the processing cores, may also be marked as critical. For example, context data in a virtual context architecture (VCA) data processing apparatus may be marked as critical. VCA is described in co-pending patent application Ser. No. 15/361,819, which is hereby incorporated by reference herein in its entirety. As another example, kernel task data in a Linux operating system may be allocated as critical.

System Architectures for Providing Protection from Transient Errors.

There are multiple configuration models for enabling this.

FIG. 1 shows an embodiment a data processing apparatus 100 having a single memory node controller (MNC 1) 108 and a single physical storage device 104. In this embodiment, a first region of storage is allocated in storage device 104 for critical data and one or more second regions are allocated, in the same device, for duplicate data. A third region of storage device 104 may be allocated for non-critical data. This approach requires less memory than a system where all data is duplicated. When a single duplicate is stored, up to half the available physical storage (in MEM 1) will be used for the purposes of data duplication. In operation, MNC 108 writes pages marked as critical twice to the same physical medium on the direction of the RAS Management Unit (RMU) 112. In this embodiment, protection is enabled for the transient errors in the critical data, where the errors are detected by parity bits, checksums, ECCs, comparison of copies etc. In one embodiment, three or more copies of data may be maintained, in which case error detection may be performed by comparing copies.

Figure 2:
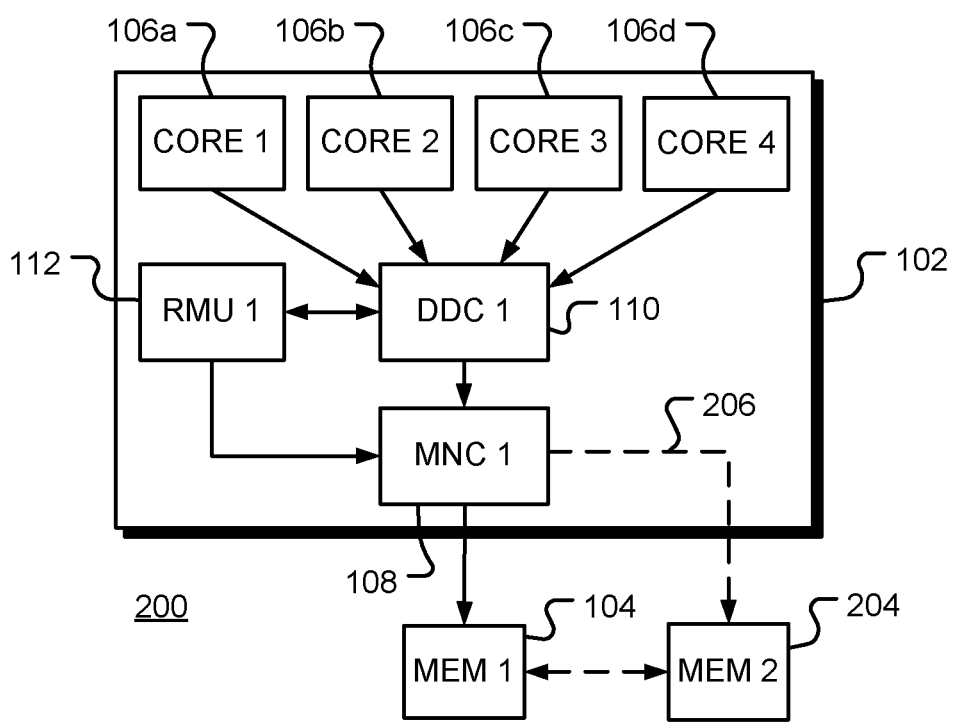
FIG. 2 shows a memory system with a single Memory Node Controller (MNC) and physical storage devices, consistent with certain embodiments of the disclosure.

FIG. 2 shows an embodiment in which a memory system of data processing apparatus 200 has a single MCN 108 and a physical storage device 104 that acts as a cache to more resilient storage device 204. Storage device 104 may operate as an inclusive cache, for example. In this embodiment, if the top-level storage device 104 fails, MNC 108 can bypass it and access the more resilient storage (MEM 2) 204. In this way, protection is provided for transient errors in storage device 104, since critical data may be recovered from storage device 204 (MEM 2). Protection is also provided for failure of storage device 104, since critical data is also stored in device 204 (MEM 2). Device 204 may be accessible directly by MNC 108 via connection 206, by passing device 104.

Further embodiments, shown in FIGS. 3-7, also help to provide protection transient errors and storage device failures.

Figure 3:
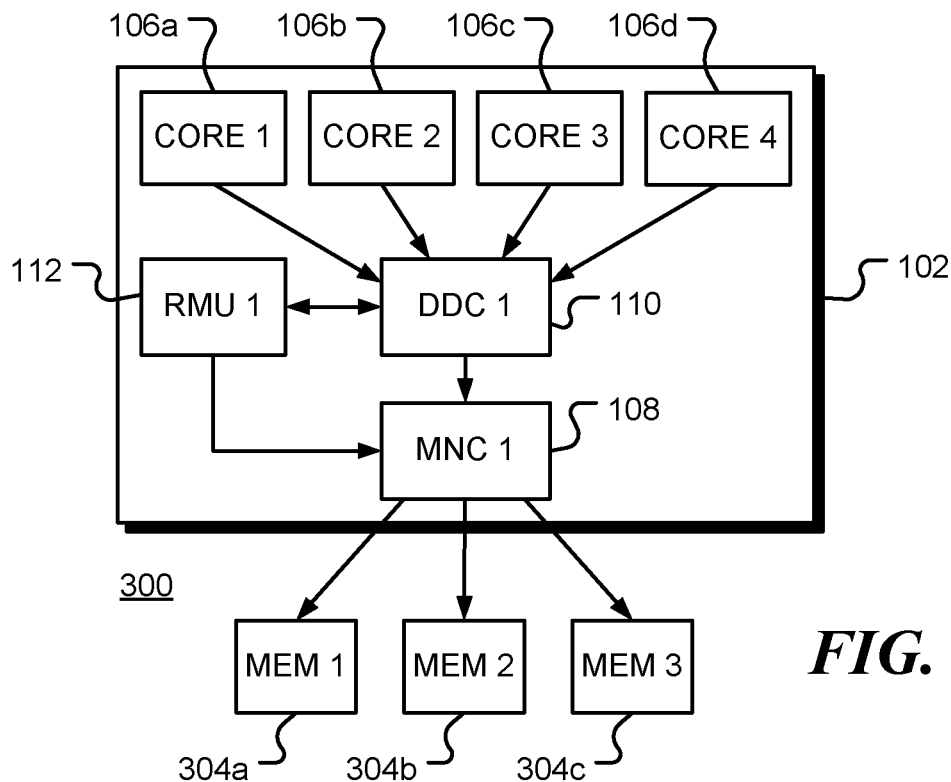
FIG. 3 shows a memory system with three storage devices coupled to a single MNC, consistent with certain embodiments of the disclosure.

FIG. 3 shows an embodiment of a memory system of data processing apparatus 300 in which three storage devices 304a, 304b and 304c are coupled to a single MNC 108. In this approach, MNC 108 will duplicate data across different physical storage devices (MEM 1, MEM 2, MEM3, etc.), so primary data stored in one storage device may be duplicated in one or more other storage devices. In this embodiment, overall storage capacity is still lost due to the need to duplicate. However, the effective memory available for storage is dependent on the amount of data marked as critical.

As discussed above, this embodiment provides protection for transient errors in memory and storage device failure.

Figure 4:
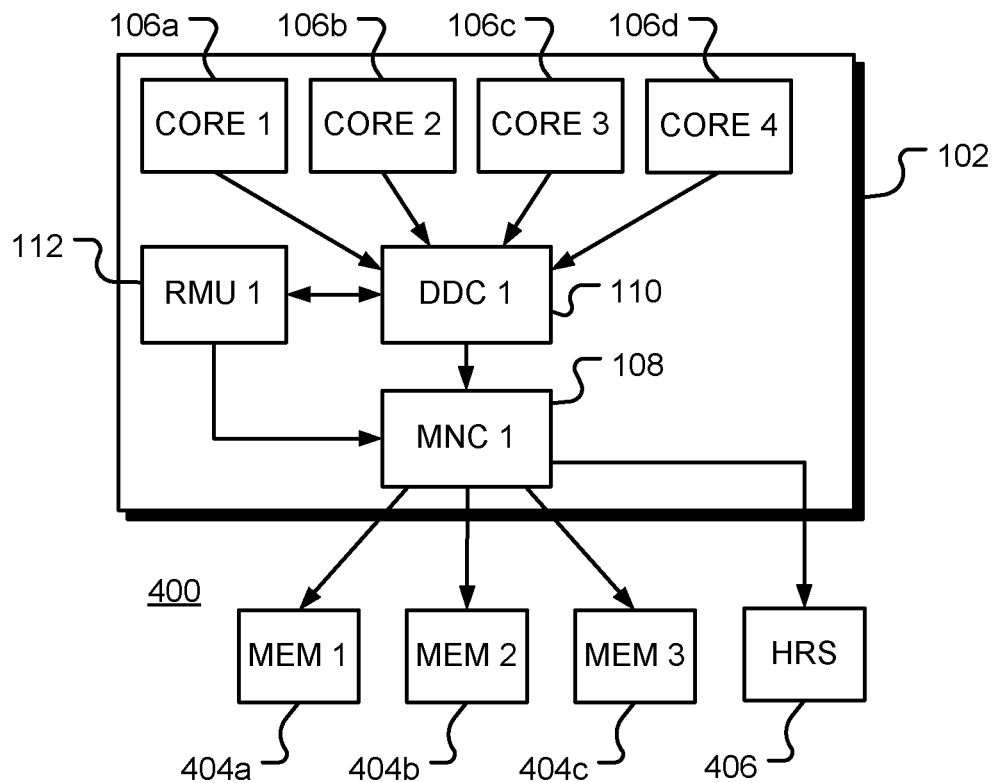
FIG. 4 shows a memory system with a single MNC, multiple physical storage devices and a dedicated high resilience storage (HRS) device, consistent with certain embodiments of the disclosure.

FIG. 4 shows an embodiment of a memory system of data processing apparatus 400 with a single MNC 108, multiple physical storage devices 404a, 404b, 404c, and a dedicated high resilience storage (HRS) device 406. In this embodiment, the MNC backs up critical data only to the HRS (High Resilient Storage) device 406 and the full storage capacity of devices 404a, 404b, 404c is available to the data processing apparatus. Protection is again provided for transient errors in memory and storage device failure.

Figure 5:
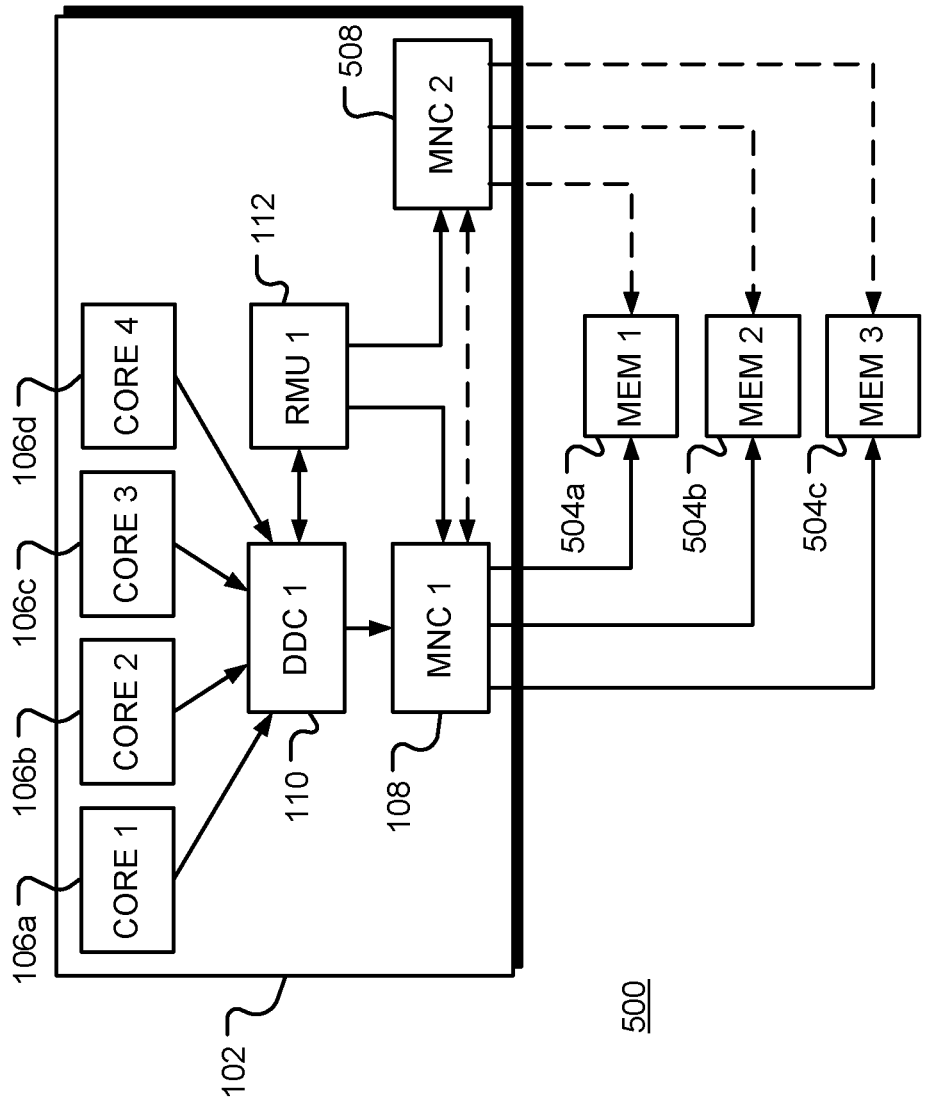
FIG. 5 shows a memory system with primary and secondary MNC's, consistent with certain embodiments of the disclosure.

FIG. 5 shows an embodiment of a memory system of data processing apparatus 500 that uses a primary MNC 108 together with a secondary MNC 508. In this embodiment, secondary MNC 508 does not have any independent real address space mapped to it. Instead, secondary MNC 508 acts as a backup to primary MNC 108. The primary MNC 108 handles the full address space. Both MNCs have access to the multiple storage devices such as 504a, 504b and 504c. The data is duplicated across the MNCs and may be periodically synchronized. Secondary MNC can interface with the same or different (for the purpose of duplicates) storage devices for the handling of critical data. In addition to mitigating transient memory errors and storage device failure, this embodiment helps in the event of MNC failure. In the case of failure in primary MNC 108, the secondary MNC 508, which has full knowledge of the primary MNC 108, can take control of all the associated storage devices. This enables the system to continue execution with one active working MNC device. MNC failure is discussed in more detail below.

Memory Allocation

In one embodiment, RMU 112 monitors storage devices connected to MNC 108 and DDC 110. In particular, the RMU may monitor device failure rates and also be aware of the nature and health of the memory devices.

On a critical range allocation (or other memory mapping), the RMU determines the number and type of redundant copies to allocate for a critical range dependent upon the monitored failure rates. For example, in a configuration with multiple storage devices, device MEM 1 may have low failure rate (FIT rate) while device MEM 2 has high failure rate. When a critical range is to be allocated to MEM 1, the RMU will allocate two copies (referred to as Dual Modular Redundancy) of the range data. However, if the critical range is to be allocated to MEM 2 (with a higher failure rate) the RMU will allocate three copies (referred to as Triple Modular Redundancy). This preserves reliable recovery in less reliable storage devices.

In addition, the RMU can decide on different methods of redundancy based on the underlying memory hardware. For example, duplicate data may be maintained as compressed data, or duplicate data may be located in disjoint memories or nodes.

Cache Coherence

In one embodiment, a cache coherence protocol is augmented with additional meta-data for cache lines that are within a critical region. On invalidation of shared state from the cache or on eviction, the RAS management unit initiates a read from memory to compare the state in memory so as to ensure that the eviction of the shared cache line from the coherence network doesn't eliminate the only correct copy of the data. For example, with 64-byte cache lines, this process results in one read of 64-byte data from memory to the RAS Management unit and comparison of these 64-bytes by some means (either direct comparison or hash function). This process is only used for critical regions.

Memory Node Controller Failure Handling Mechanism in a Reliability-Aware Memory System.

A further aspect of the disclosure relates to a methodology and system architecture for recovering from memory node controller failures. MNC failure may be detected in a variety of ways. For example, failure may be detected when a load operation to an MNC is unresponsive or when a MNC fails to response to a periodic health check message.

In order to ensure that recovery from an MNC failure is possible, all the range tables (or other memory mapping tables) and pointers to range tables may be set up as critical ranges, as discussed above. When a primary MNC becomes unresponsive, all storage devices are routed to the secondary backup MNC and all requests to the managed storage regions, are routed through the secondary MNC.

When a request from the DDC is sent to the MNC, the DDC will maintain the data until the MNC acknowledges the completion of the operation. If the acknowledgement message does not arrive and the primary MNC is unresponsive, the requests will be re-routed towards the secondary MNC as soon as the MNC failure data recovery mode finalizes.

Figure 6:
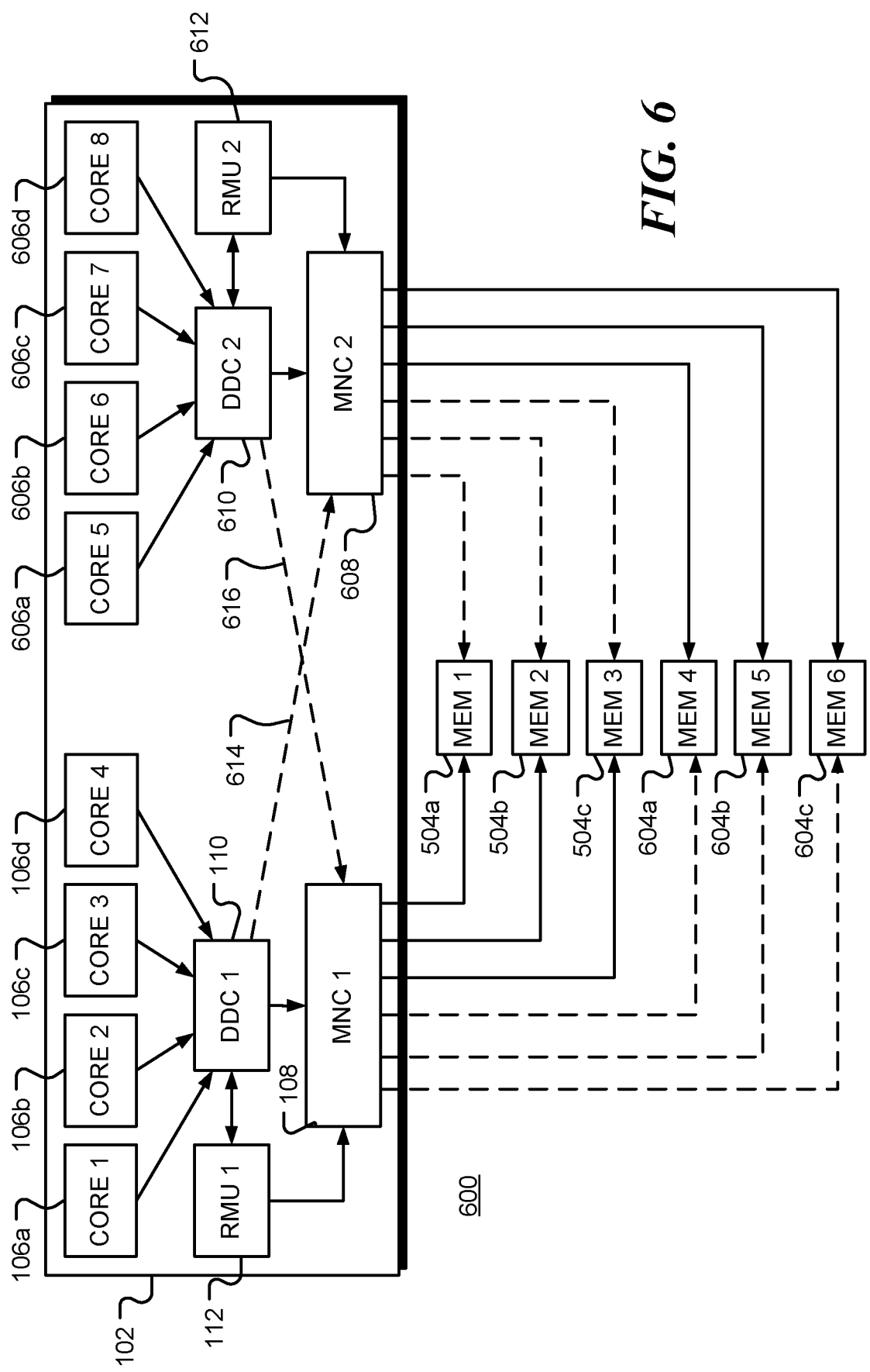
FIG. 6 shows a memory system that utilizes two MNC's, consistent with certain embodiments of the disclosure.

FIG. 6 shows an embodiment of a memory system of data processing apparatus 600 that utilizes two MNCs. MNC 1 (108), RMU 1 (112) and DDC 1 (110) provide access for cores 106a, 106b, 106c and 106d, while MNC 2 (608), RMU 2 (612) and DDC 2 (610) provide access for cores 606a, 606b, 606c and 606d, In this embodiment, MNC data is duplicated across MNC 1 (108) and MNC 2 (608). Prior to any failure, storage devices 504a, 504b and 504c are under MNC 1 (108) as indicated by the solid arrows and storage devices 604a, 604b and 604c are under MNC 2 (608), again, as indicated by the solid arrows. Given that the address space is partitioned between MNCs, the MNC to which the range belongs will hold the primary copy, and all other MNCs used for backup will hold the backup copy. For example, if MNC 1 fails, DDC 1 (110) will route all memory requests to MNC 2 (608), as indicated by the broken line 614, and MNC 2 (608), with the backup copy of MNC 1 mapping, will take over data management of the storage device 504a, 504b and 504c (MEM 1, MEM 2 and MEM 3), as indicated by the broken lines from MNC 2. The devices were originally under MNC 1. Similarly, if MNC 2 fails, DDC2 (610) will route all memory requests to MNC 1 (108), as indicated by the broken line 616, and MNC 1 (608), with the backup copy of MNC 2 mapping, will take over data management of the storage device 604a, 604b and 604c (MEM 4, MEM 5 and MEM 6), as indicated by the broken lines from MNC 1. The devices were originally under MNC 2. Therefore, to continue execution of the system in the presence of a failed MNC, the dual-MNC node will become a single MNC node, but will continue to process memory requests as normal. The overarching system will be notified of the MNC failure, where appropriate, and gradual recovery and phasing out processes can be initiated.

Figure 7:
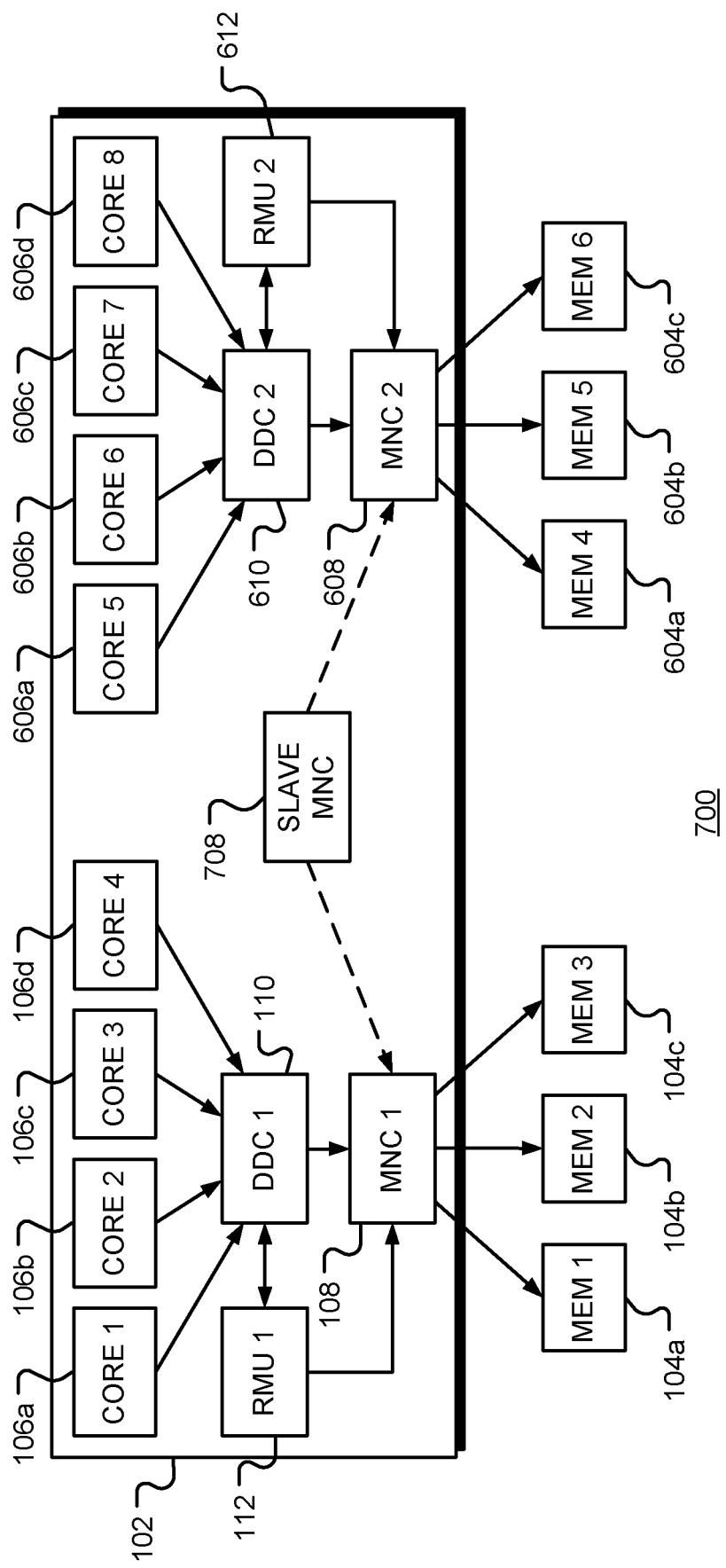
FIG. 7 shows a memory system with multiple MNCs and a slave MNC, consistent with certain embodiments of the disclosure.

FIG. 7 shows an embodiment of data processing apparatus 700 with multiple MNCs and a slave MNC. In this embodiment, the MNC data of both MNCs, 108 and 608 in node 102 are duplicated to slave MNC 708—in a similar manner to FIG. 6, where a backup is copied into the partner MNC. Just as in the previous embodiment, on an MNC failure in either MNC 1 or MNC 2, the slave MNC will be tasked to replace the failed MNC by bypassing the connections between the DDC and associated Memories. During recovery mode, the range-table and address-mapping of the failed MNC are copied onto slave MNC 708 to resume execution.

Figure 8:
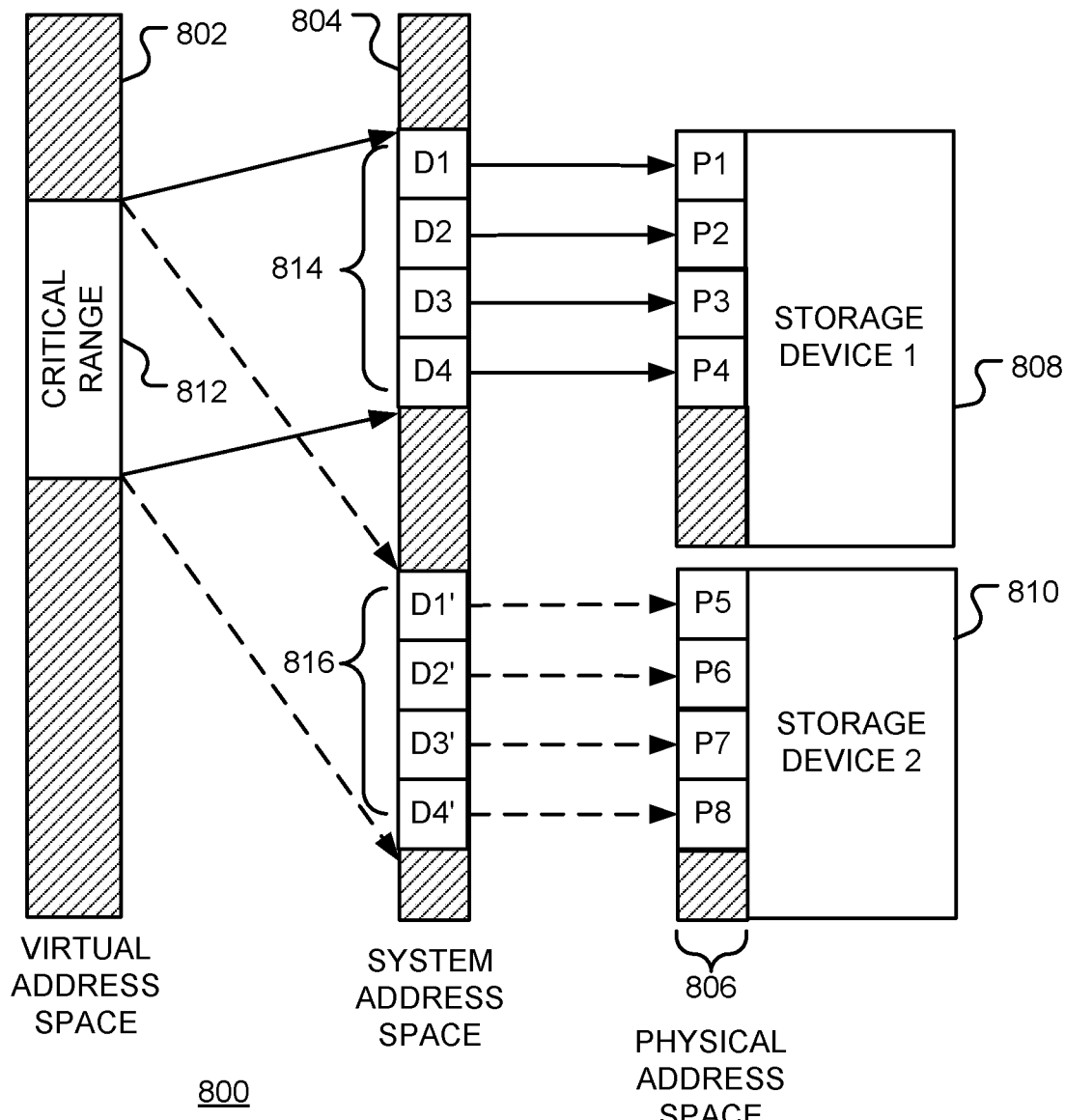
FIG. 8 illustrates a logical arrangement of memory in a data processing system, consistent with certain embodiments of the disclosure.

FIG. 8 illustrates a logical arrangement of memory 800 in a data processing system, consistent with embodiments of the disclosure. The memory arrangement includes a virtual memory address space 802. Although a single virtual memory address space 802 is shown in FIG. 8, each program, or device sees its own virtual memory address space that contains instructions and data for use by that program or device. Programming threads may share the same virtual memory address space. The use of virtual memory addressing allows memory access to be controlled by preventing one program from accessing or corrupting information used by another program. Memory arrangement 800 also includes a system address space 804. The system address space allows access to addressable units in the data processing system, such as memory, storage, hardware accelerators and network interface controllers. The system address space may contain both physical (memory backed) addresses and virtual memory addresses. Memory arrangement 800 also includes a physical address space 806 that contains physical addresses in data resources such as memory devices or storage devices, for example. Storage devices 808 and 810 are shown in FIG. 8, but a data processing system may have any number of storage devices.

The one or more virtual memory address spaces are divided into address ranges, such as address range 812 in FIG. 8. Each range may be defined by two parameters, such as start and end addresses, a start address and an extent (length), or offsets from a reference address, for example. Each range in the virtual memory address space is mapped to a corresponding range in the system address space. For example, virtual memory address range 812 is mapped to system address range 814. Each system address range is further divided into a number of divisions. In the example shown in FIG. 8, the system address range 814 has four divisions, denoted as D1, D2, D3 and D4. In one embodiment, each division corresponds to a page of memory or storage, but other sized divisions may be used without departing from the present disclosure. The mapping is referred to as a first layer mapping and may be recorded and implemented using a range table buffer, for example. Each system address range is handled by a memory mode controller.

Each division of a system address range is mapped to a page in a data resource. For example, division D1 is mapped to page P1 in storage device 808, division D4 is mapped to page P4 in storage device 808, etc. This mapping is referred to as a second layer mapping and may be recorded and implemented in a system-to-physical translation cache, for example.

In the example shown, virtual address range 812 or system address range 814 is designated as a critical range to be used for critical data. In this case, a duplicate or redundant system address range 816 is maintained and mapped to pages P5, P6, P7 and P8 in storage device 2 (810). Data in the critical address range is stored in storage device 808 and a copy of the data is stored in storage device 810 as a backup. The backup copy is used when an un-correctable error is found the data stored in storage device 808. In addition, should storage device 808 fail, the memory node controller will use storage device 810. The association of ranges 814 and 816 is recorded in the RMU, so that data write from critical range 812 is duplicated. Ranges 814 and 816 may be handled the same MNC or different MNCs.

Figure 9:
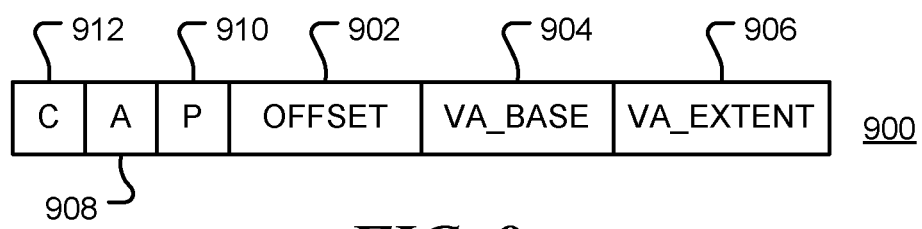
FIG. 9 illustrates an entry of a range table, consistent with certain embodiments of the disclosure.

FIG. 9 illustrates a range table entry 900 that describes a mapping between a range of virtual addresses and a range of system addresses, consistent with embodiments of the disclosure. In the embodiment shown, the entry 900 includes a virtual memory address base value 904 (VA_BASE) and a virtual address extent 906, (VA_EXTENT). These indicate an address range from VA_BASE to VA_BASE+VA_EXTENT. Field 902 contains an offset that, when added to a virtual memory address, indicates the system address corresponding to the virtual memory address. Thus, the offset value is used to translate a virtual memory address to a system address. The range table entry 900 also includes administrative field 908, for various administrative and status data, and permissions field 910, which may contain memory access permission. The range table entry also contains a criticality bit 912 indicating whether or not the range contains critical data.

The range table provides a first layer of address mapping. A further table may be used to indicate the second layer of address mapping—from system address space to physical address space. This further table may also use criticality bits to indicate memory regions allocated for storage of critical data.

Figure 10:
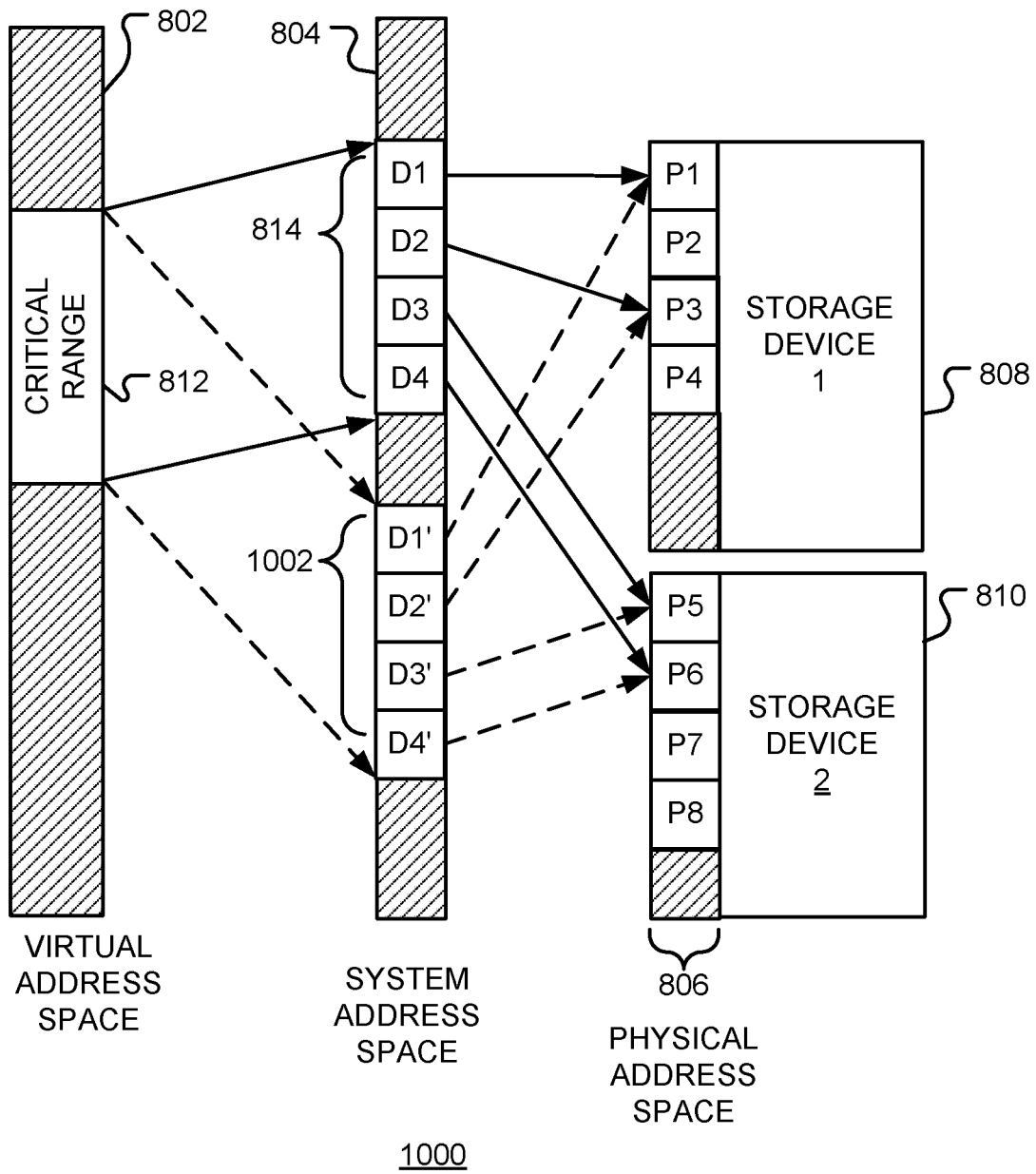
FIG. 10 illustrates a further logical arrangement of memory, consistent with certain embodiments of the disclosure.

FIG. 10 illustrates a further logical arrangement of memory 1000 in a data processing system, consistent with embodiments of the disclosure. The memory arrangement includes virtual memory space 802, system memory space 804 and physical memory space 806. Physical memory space is mapped between storage devices 808 and 810 in this example. Critical range 812 is mapped to system address space 814 assigned to a first memory node controller (MNC). The critical range 812 is also handled by a second MNC that contains a copy 1002 of the system address range. The second MNC provides a backup in the event that the first MNC fails. In the example shown, system address range 1002 is mapped to the same physical locations as the first system address range 814. For example, system divisions D1 and D1' both map to physical page P1. In a further embodiment, system address range is mapped to a different physical location to provide backup for data errors or storage device failures.

Figure 11:
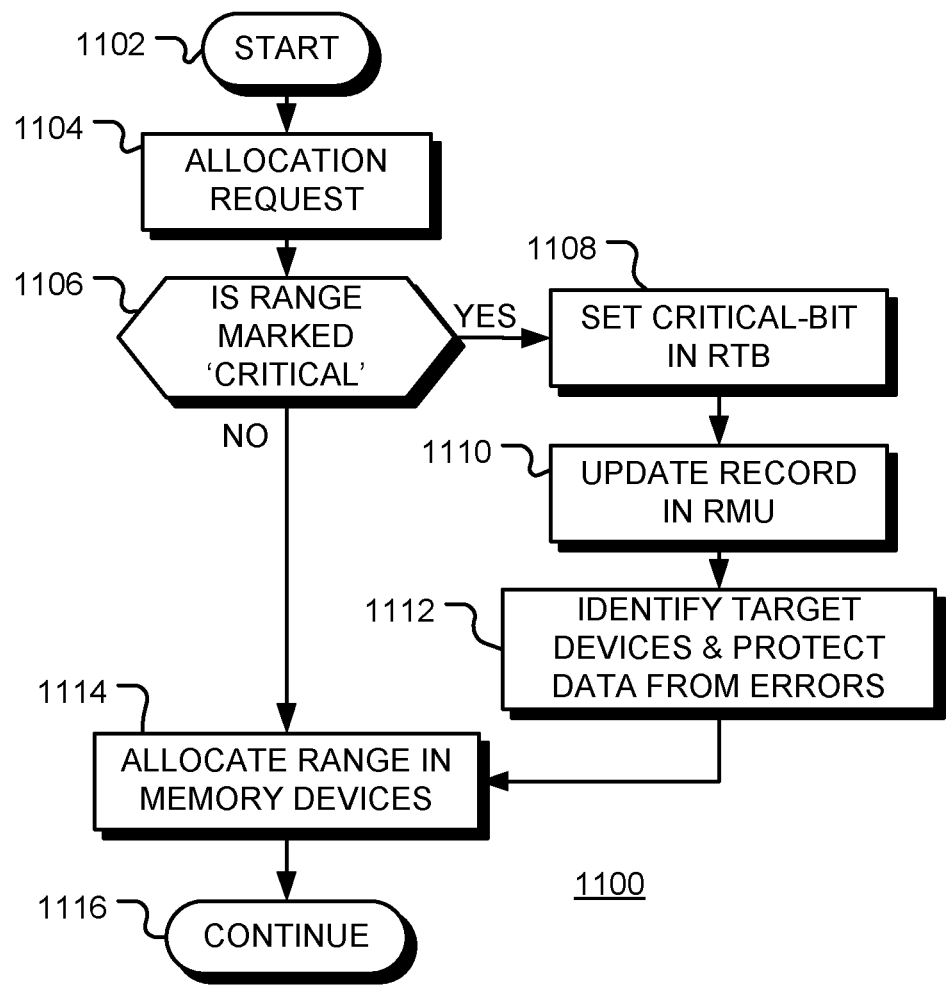
FIG. 11 is a flow chart of a method of memory allocation in a memory system, consistent with certain embodiments of the disclosure.

FIG. 11 is a flow chart of a method 1100 of memory allocation in an memory system consistent with the present disclosure. Following start block 1102, an allocation request, such as a 'malloc' instruction for allocation of a memory range, is issued at block 1104. If the range is marked as 'critical', as depicted by the positive branch from decision block 1106, a critical-bit is set in the range table buffer at block 1108, to indicate that the range contains critical data, and a corresponding record is updated in the RMU at block 1110 to identify the association between the primary range and the secondary or backup range. At block 1112, the RMU identifies target devices for memory allocation and protects the data from errors. This may be done by duplicating the data, in the case of data duplication for protection, storing the data in HRS, or calculating and storing an error correction code (ECC), checksum or parity bit. At block 1114, the memory range is allocated in the storage devices. The allocation is then complete and further operation of the data processing system continues at block 1116.

Figure 12:
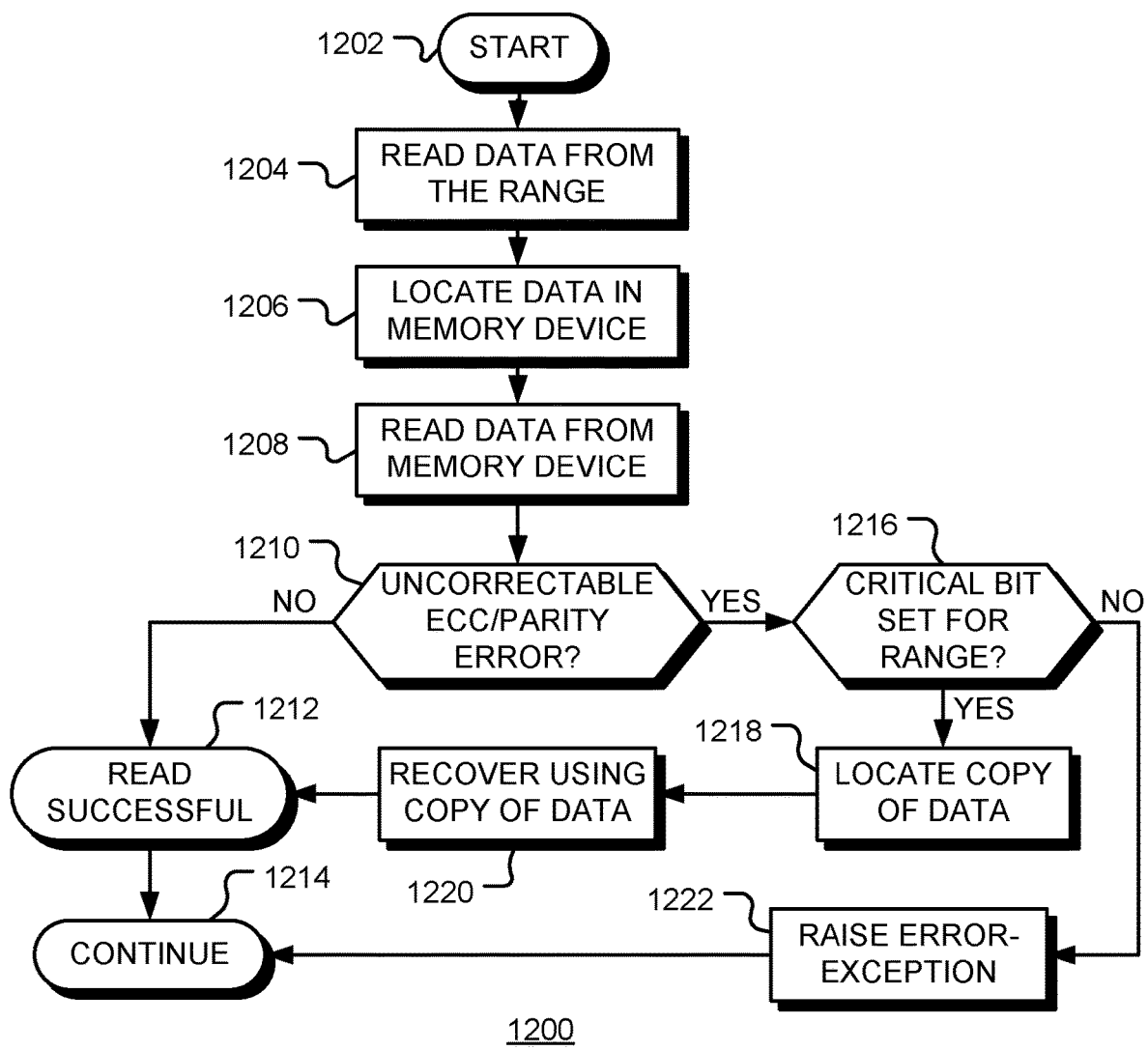
FIG. 12 is a flow chart of a method for reading data in a memory system, consistent with certain embodiments of the disclosure.

FIG. 12 is a flow chart of a method 1200 for reading data in a memory system consistent with the present disclosure. Following start block 1202, a request to read data from a particular memory range is received at block 1204. At block 1206, the MNC determines a location of the requested data in a storage device using the range table buffer (or some other memory mapping mechanism). At block 1208, the requested data is read from the storage device and any correctable error is corrected, using the ECC for example. If there is no uncorrectable error, as depicted by the negative branch from decision block 1210, the read is successful, as indicated by block 1212, the read operation is complete and further operation continues at block 1214. However, when an uncorrectable error is detected, as depicted by the positive branch from decision block 1210, the critical bit associated with the range, in the range table of the MNC, is tested at block 1216. When the critical bit is set, as depicted by the positive branch from decision block 1216, it is known that a copy of the data is maintained. A location of a copy of the data is determined at block 1218 (from the record in the RMU, for example) and, at block 1220, the copy is used to recover from the data error. Despite the uncorrectable error in the original data, the read is successful, as indicated by block 1212. However, if the critical bit in the range table is not set, as depicted by the negative branch from decision block 1216, the data cannot be recovered and an error exception is raised at block 1222. In this manner, critical data is protected without an excessive use of redundant memory.

Figure 13:
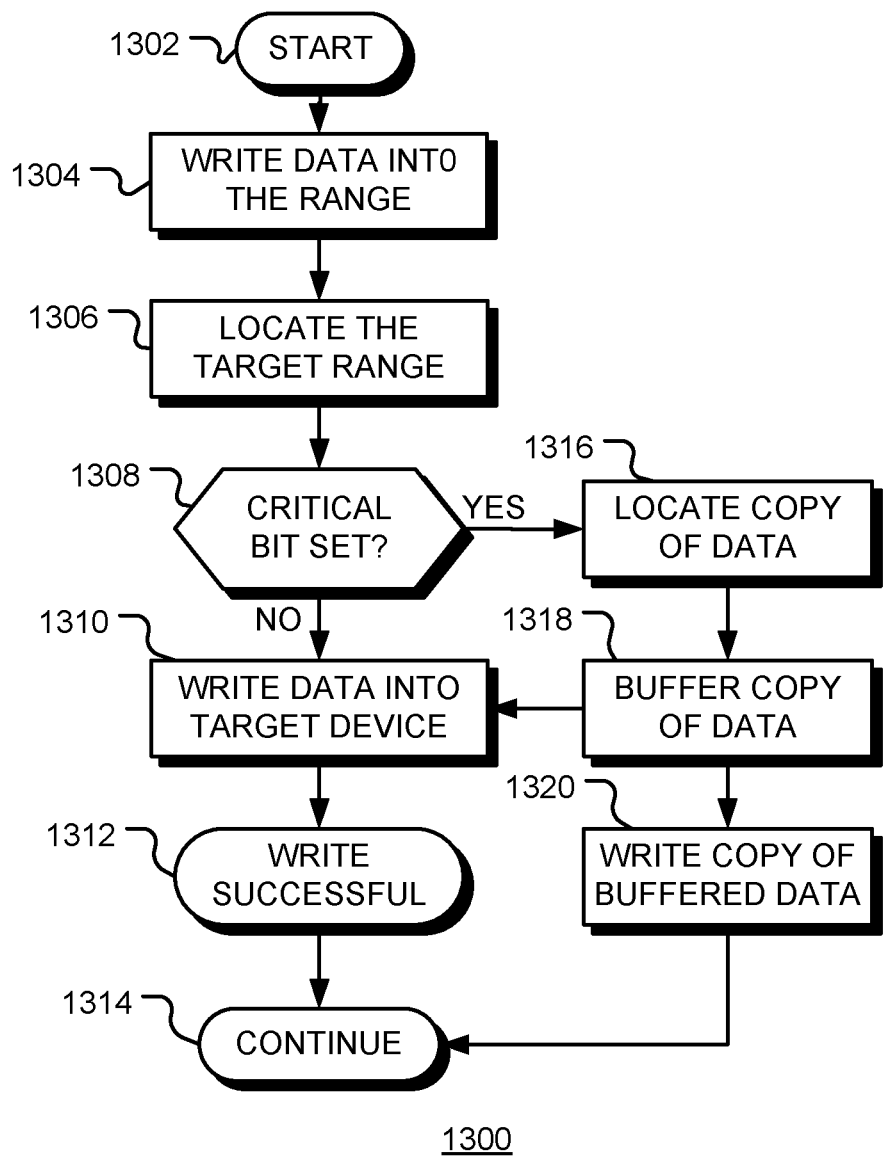
FIG. 13 is a flow chart of a method for writing data in a memory system, consistent with certain embodiments of the disclosure.

FIG. 13 is a flow chart of a method 1300 for writing data in a memory system consistent with the present disclosure. Following start block 1302, a request to write data into a particular memory range is received at block 1304. At block 1306, the MNC locates the primary target range for the data using the range table. If the critical bit for the located range is not set, as depicted by the negative branch from decision block 1308, the data is written to the target device at block 1310. The write is successful, as indicated by block 1312 and further operation continues at block 1314. If the critical bit for the located range is set, as depicted by the positive branch from decision block 1308, a secondary location—for a redundant or backup copy of the data—is determined at block 1316. A copy of the data to the written is buffered in the RMU at block 1318. The data is written to primary target device at block 1310 and, in parallel, the buffered data is written to the secondary target at block 1320. Further operation continues at block 1314.

Figure 14:
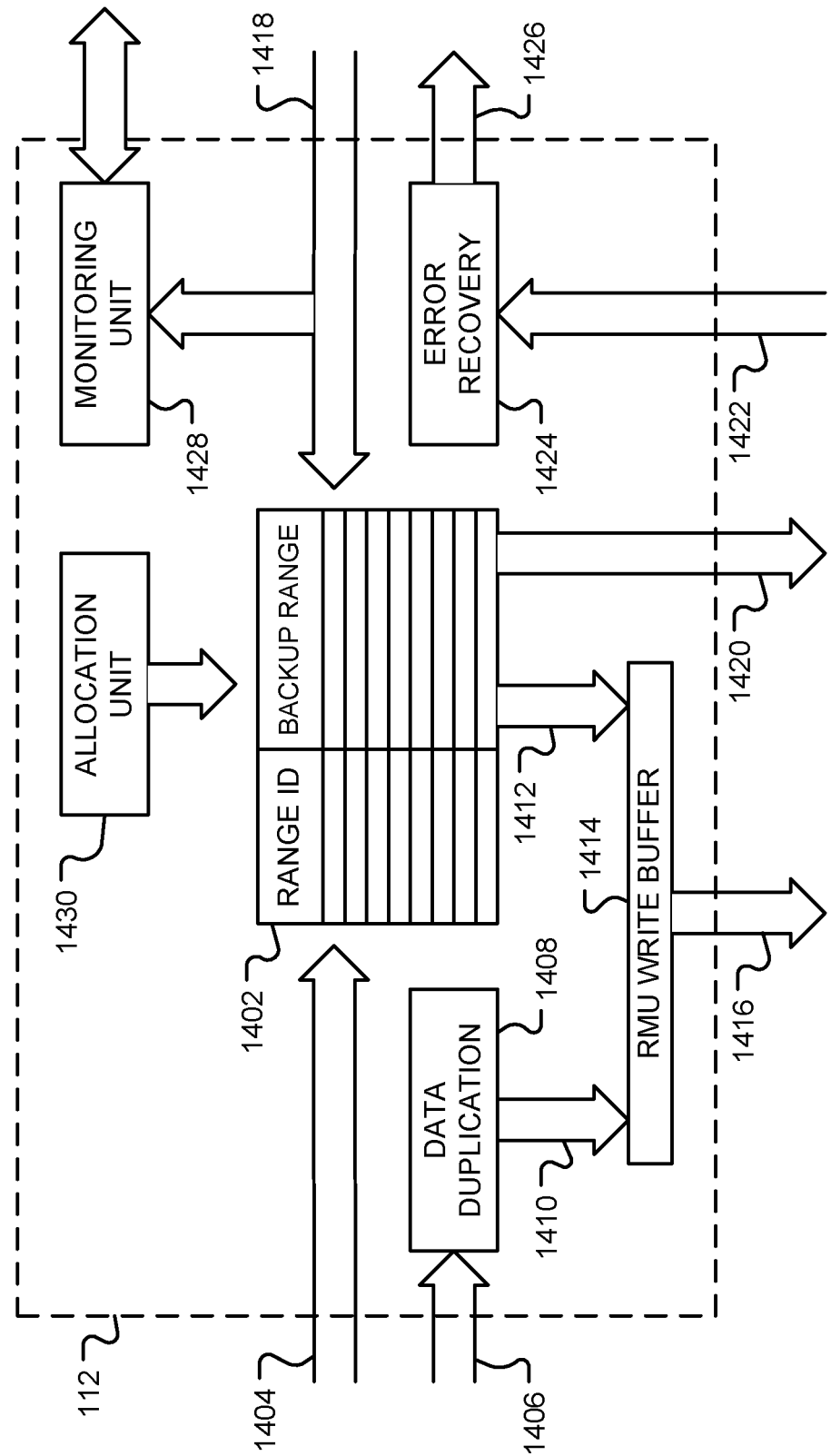
FIG. 14 is a block diagram of a Reliability Availability and Service (RAS) management unit (RMU), consistent with certain embodiments of the disclosure.

FIG. 14 is a block diagram of a RAS management unit (RMU) 112, consistent with certain embodiments of the disclosure. RMU 112 includes a critical range table 1402 that stores a record of backup ranges for critical ranges. In the example shown, the table is indexed by a range identifier (RANGE ID) and stores a description of the backup range (such as base address and extent, for example). Critical range table 1402 is updated when memory is allocated for a critical range. When a write operation is initiated, a target range ID 1404 for the write is passed to critical range table 1402 and the table is used to identify the backup range. The data 1406 for the write is passed to data duplication unit 1408 to provide one or more copies 1410 to be written to backup storage. The duplicated data 1410 and the identified backup range 1412 are provided to RMU write buffer 1414 that generates a write request 1416 to the MNC.

When a read operation results in an unrecoverable error, a target range ID 1418 for the read is used to identify the corresponding backup range in the critical range table 1402. A read request 1420 is generated for the MNC to retrieve the backup data. The backup data 1422 from the MNC is returned to the error recovery unit 1424 that, in turn, returns the recovered correct data 1426 to the original requestor.

RMU 112 may also include monitoring unit 1428 that monitors performance of the memory system. This may be done by signaling MCNs and/or by monitoring target range IDs 1418, for example. Detected failures may be used to substitute a secondary or slave storage device or an MNC for the failed device. In addition, error rates for MNCs and storage devices may be used in allocation unit 1430 to determine, or adjust, the number and location of the backup copies of critical data when memory is allocated for a critical range.

Generally, the functional elements of the memory system described above may be implemented on one or more chips.

In operation, RMU 112 enables a method of memory management with improved RAS. Responsive to a request to allocate memory allocation for critical data, first memory is allocated in a primary storage device for storing the critical data and an entry in a memory mapping table that maps to the allocated memory in the primary storage device to indicate that the first memory contains critical data. Second memory, for storing one or more copies of the critical data, is allocated by the RMU and the association between the first memory and the second memory is recorded in the critical range table. The second (backup) memory for storing one or more copies of the critical data may be allocated in the primary storage device or in one or more secondary storage devices. The RMU may monitor the primary storage device and, when a failure is detected in the primary storage device, cause the primary storage device to be replaced with a storage device of the one or more secondary storage device.

The failure rate of the primary storage device may be monitored to determine (dependent upon the monitored failure rate) a number of copies of the critical data.

When an unrecoverable error in first critical data read from the primary storage device is detected, the first critical data is replaced with a stored copy of the critical data.

The primary storage device may be accessed via a primary memory node controller (MNC) and a secondary MNC and where the memory mapping table comprises a first memory mapping table accessed by the primary MNC. In this arrangement, the first memory mapping table may be duplicated in the secondary MNC as a second memory mapping table. The primary MNC is monitored by the RMU. When no failure is detected in the primary MNC, the primary storage device is accessed via the primary MNC. However, when a failure is detected in the primary MNC, the primary storage device is accessed via the secondary MNC.

In response to a write instruction for first data, the memory mapping table (such as a range table) is used to determine when the first data are critical data targeted to the first memory. When the first data are critical data, the first data is written to the first memory and the second memory is identified using the recorded association between the first memory and the second memory, as in critical range table 1402, for example. A duplicate of the first data is then written to the second memory.

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope of the invention as defined by the appended claims.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some features of the disclosed embodiments are set out in the following numbered items:

1. A memory system for a data processing apparatus, the memory system comprising: a fault management unit; a first memory controller; and a first storage device accessible via the first memory controller and configured for storing first data in a first subset of data; where the fault management unit is configured for: detecting a fault in the first data, the first storage device or the memory node controller; and correcting the fault; where the first subset of data is designated as fault protected; where the memory system maintains one or more copies of the first data, and where the first memory controller comprises a memory management unit or a memory node controller.

2. The memory system of item 1, where correcting the fault in the first data comprises correcting the error using an error correcting code of the first data.

3. The memory system of item 1, where the one or more copies of the first data comprises a primary copy and a secondary copy, where correcting the fault in the first data comprises accessing the secondary copy of the first data when a fault is detected in the primary copy of the first data.

4. The memory system of item 3, where the primary and secondary copies of the first data are stored in the first storage device.

5. The memory system of item 3, further comprising a second storage device, where the primary copy of the first data is stored in the first second storage device and the secondary copy is stored in the second storage device.

6. The memory system of item 1, where second data in a second subset of data is designated as being not fault protected, and where the memory system does not provide fault protection for the second data.

7. The memory system of item 1, where the first data comprises mapping data indicative of a mapping between virtual addresses and physical addresses in the data processing apparatus.

8. The memory system of item 1, where the mapping data comprises a range table.

9. The memory system of item 1, where the first data comprises context data indicative of a context of a processing thread executing in a data processing apparatus.

10. The memory system of item 1, where correcting the fault comprises selecting a substitute storage device when the fault is detected in the first storage device, where the substitute storage device is accessible via the first memory controller.

11. The memory system of item 1, where correcting the fault comprises selecting a substitute memory controller when the error is detected in the first memory controller, where the first storage device is accessible via the second memory controller.

12. A non-transient computer readable medium containing instructions of a hardware description language descriptive of the memory system of item 1.

13. A non-transient computer readable medium containing a netlist description of the memory system of item 1.

14. A method of memory management comprising: responsive to a request to allocate memory for fault protected data: allocating first memory in a primary storage device for storing the fault protected data; marking an entry in a memory mapping table to indicate that the first memory contains fault protected data; allocating second memory for storing one or more copies of the fault protected data; and recording an association between the first memory and the second memory.

15. The method of item 14, where allocating second memory for storing one or more copies of the fault protected data comprises allocating memory in the primary storage device.

16. The method of item 14, where allocating second memory for storing one or more copies of the fault protected data comprises allocating memory in one or more secondary storage devices.

17. The method of item 16, further comprising: monitoring the primary storage device; and when a failure is detected in the primary storage device, replacing the primary storage device with a storage device of the one or more secondary storage device.

18. The method of item 14, further comprising: monitoring a failure rate of the primary storage device; and determining a number of copies of the fault protected data dependent upon the monitored failure rate.

19. The method of item 14, further comprising: detecting an error in first fault protected data read from the primary storage device; and when the detected error in not correctable, replacing the first fault protected data with corresponding data stored in the second memory.

20. The method of item 14, where the primary storage device is accessed via a primary memory node controller (MNC) and a secondary MNC and where the memory mapping table comprises a first memory mapping table accessed by the primary MNC, the method further comprising: duplicating the first memory mapping table in the secondary MNC as a second memory mapping table; monitoring the primary MNC; when no failure is detected in the primary MNC, accessing the primary storage device via the primary MNC; and when a failure is detected in the primary MNC, accessing the primary storage device via the secondary MNC.

21. The method of item 14, further comprising: responsive to a write instruction for first data: determining, from the memory mapping table, when the first data are fault protected data to be written to the first memory; and when the first data are fault protected data: writing the first data to the first memory; identifying the second memory using the recorded association between the first memory and the second memory; and writing the first data to the second memory.

22. A method for allocating storage in a memory system, the method comprising, responsive to a request to allocate storage for data: determining when the data is fault protected data; when the data is fault protected data, determining a level of failure protection for the fault protected data dependent upon failure characteristics of the memory system; and allocating storage dependent upon the level of failure protection; where the level of failure protection comprises one or more of: a number of copies of the fault protected data; an error correction code of the fault protected data; and a storage location of the fault protected data.

23. The method of item 22, where the memory system comprises a plurality of devices, the method further comprising: monitoring rates of correctable and uncorrectable errors of the devices of the memory system to provide a measure of device health; and updating the failure characteristics dependent upon the measured health of the devices.

24. The method of item 22, where the measure of device health comprises a probability of failure of a device.

25. The method of item 22, where the rates of correctable and uncorrectable errors of the devices are measured over a period of time or a number of memory accesses.

The invention claimed is:

1. A memory system for a data processing apparatus, the memory system comprising:
   a fault management unit;
   a first memory controller; and
   a first storage device accessible via the first memory controller and configured for storing first data in a first subset of data, the first subset of data designated as fault protected;
where the fault management unit is configured for:
   monitoring rates of correctable and uncorrectable errors in the memory system;
   updating failure characteristics based, at least in part, upon the rates of correctable and uncorrectable errors;
   determining a level of failure protection for the first data dependent upon failure characteristics of the memory system; and
   allocating storage in the memory system based, at least in part, upon the level of failure protection; and
   where the level of failure protection includes one or more of:
   a number of copies of the first data stored in the memory system;
   an error correction code of the first data; and
   a storage location, in the memory system, of the first data.

2. The memory system of claim 1, where the fault management unit is further configured for:
   detecting a fault in the first data, the first storage device or the first memory controller; and
   correcting the fault in the first data using an error correcting code of the first data.

3. The memory system of claim 1, where the memory system maintains a primary copy of the first data and a secondary copy of the first data, and the fault management unit is further configured for:
   detecting a fault in the primary copy of the first data; and
   correcting the fault in the primary copy the first data by accessing the secondary copy of the first data.

4. The memory system of claim 3, where the primary and secondary copies of the first data are stored in the first storage device.

5. The memory system of claim 3, further comprising a second storage device, where the primary copy of the first data is stored in the first storage device and the secondary copy is stored in the second storage device.

6. The memory system of claim 1, where second data in a second subset of data is designated as being not fault protected, and where the memory system does not provide fault protection for the second data.

7. The memory system of claim 1, where the first data comprises mapping data indicative of a mapping between virtual addresses and physical addresses in the data processing apparatus.

8. The memory system of claim 1, where the mapping data comprises a range table.

9. The memory system of claim 1, where the first data comprises context data indicative of a context of a processing thread executing in a data processing apparatus.

10. The memory system of claim 1, where the fault management unit is further configured for:
    detecting a fault in the first storage device; and
    correcting the fault in the first storage device by selecting a substitute storage device accessible via the first memory controller.

11. The memory system of claim 1, where the fault management unit is further configured for:
    detecting a fault in the first memory controller; and
    correcting the fault in the memory controller by selecting a substitute memory controller when the error is detected in the first memory controller, where the first storage device is accessible via the second memory controller.

12. A non-transitory computer readable medium containing instructions of a hardware description language descriptive of the memory system of claim 1.

13. A non-transitory computer readable medium containing a netlist description of the memory system of claim 1.

14. A method of memory management comprising:
    responsive to a request to allocate memory for fault protected data:
    allocating first memory in a primary storage device for storing the fault protected data;
    marking an entry in a memory mapping table to indicate that the first memory contains fault protected data;
    allocating second memory for storing one or more copies of the fault protected data; and
    recording an association between the first memory and the second memory,
    the method further comprising:
    monitoring a failure rate of the primary storage device; and
    determining a number of copies of the fault protected data dependent upon the monitored failure rate.

15. The method of claim 14, where allocating second memory for storing one or more copies of the fault protected data comprises allocating memory in the primary storage device.

16. The method of claim 14, where allocating second memory for storing one or more copies of the fault protected data comprises allocating memory in one or more secondary storage devices.

17. The method of claim 16, further comprising:
    monitoring the primary storage device; and
    when a failure is detected in the primary storage device, replacing the primary storage device with a storage device of the one or more secondary storage device.

18. The method of claim 14, further comprising:
    detecting an error in first fault protected data read from the primary storage device; and
    when the detected error in not correctable, replacing the first fault protected data with corresponding data stored in the second memory.

19. The method of claim 14, where the primary storage device is accessed via a primary memory node controller (MNC) and a secondary MNC and where the memory mapping table comprises a first memory mapping table accessed by the primary MNC, the method further comprising:
- duplicating the first memory mapping table in the secondary MNC as a second memory mapping table;
- monitoring the primary MNC;
- detecting a failure in the primary MNC;
- prior to detecting a failure in the primary MNC, accessing the primary storage device via the primary MNC; and
- subsequent to detecting a failure in the primary MNC, accessing the primary storage device via the secondary MNC.

20. The method of claim 14, further comprising:
responsive to execution of a write instruction for first data:
- determining, from the memory mapping table, the first data to be fault protected first data to be written to the first memory or first data that is not fault protected;
- writing the fault protected first data to the first memory;
- identifying the second memory using the recorded association between the first memory and the second memory; and
- writing the fault protected first data to the second memory.

21. A method for allocating storage in a memory system comprising a plurality of devices, the method comprising, responsive to a request to allocate storage for data:
- determining the data to be fault protected data or data that is not fault protected;
- determining a level of failure protection for fault protected data dependent upon failure characteristics of the memory system and allocating storage dependent upon the level of failure protection;

where the level of failure protection comprises one or more of:
- a number of copies of the fault protected data;
- an error correction code of the fault protected data; and
- a storage location of the fault protected data, the method further comprising:
- monitoring rates of correctable and uncorrectable errors of the plurality of devices of the memory system to provide a measure of device health; and
- updating the failure characteristics dependent upon the measured health of the plurality of devices.

22. The method of claim 21, where the measure of device health comprises a probability of failure of a device.

23. The method of claim 21, where the rates of correctable and uncorrectable errors of the devices are measured over a period of time or a number of memory accesses.

* * * * *